United States Patent [19]

Clark et al.

[11] Patent Number: 4,692,993

[45] Date of Patent: Sep. 15, 1987

[54] SCHOTTKY BARRIER CHARGE COUPLED DEVICE (CCD) MANUFACTURE

[76] Inventors: Marion D. Clark, 11725 Montana Ave., Los Angeles, Calif. 90049; C. Lawrence Anderson, 4409 Henley Ct., Westlake Village, Calif. 91360

[21] Appl. No.: 784,447

[22] Filed: Oct. 4, 1985

Related U.S. Application Data

[60] Division of Ser. No. 520,745, Aug. 5, 1983, abandoned, which is a continuation of Ser. No. 209,190, Nov. 17, 1980, abandoned, which is a continuation of Ser. No. 966,939, Dec. 5, 1978, abandoned.

[51] Int. Cl.$^4$ .................. H01L 21/24; H01L 29/56
[52] U.S. Cl. ...................................... 437/53; 357/15; 357/24
[58] Field of Search .................. 357/24 M, 24 R, 15; 29/571, 590, 591; 148/DIG. 139

[56] References Cited

U.S. PATENT DOCUMENTS

| | | | |
|---|---|---|---|
| 3,700,932 | 10/1972 | Kahng | 307/304 |
| 3,869,572 | 5/1975 | Carter | 357/24 |
| 3,909,925 | 10/1975 | Forbes et al. | 357/24 |
| 3,931,674 | 1/1976 | Amelio | 29/589 |
| 4,035,906 | 7/1977 | Tasch et al. | 29/589 |
| 4,148,132 | 4/1979 | Bowen | 29/571 |
| 4,179,793 | 12/1979 | Hagiwara | 29/589 |
| 4,264,915 | 4/1981 | Bierhenke et al. | 357/24 |

OTHER PUBLICATIONS

*Applied Physics Lett.*, vol. 32, (15 Mar. 78), pp. 383–385, Deyhimy et al, "GaAs Charge–Coupled Devices".
Proc. of Int. Conf. Tech. and Applications Charge Coupled Devices, Edinburgh (9/74), pp. 270–273, Hughes et al., "A CCD on Galium Arsenite".
*Proc. IEEE.*, vol. 60 (11/72), pp. 1444–1445, Scheurmeyer et al., "New Structures for Charge–Coupled Devices".
IEEE. 1977, International Electron Devices Meeting, (Dec. 1977), p. 599, Kellner et al., "A Schottky–Barrier CCD on GaAs".

*Primary Examiner*—Brian E. Hearn
*Assistant Examiner*—C. T. Huang

[57] ABSTRACT

The specification describes a planar gallium arsenide charge coupled device and process for making same wherein a first series of metal pattern forming steps are performed on the surface of a GaAs semiconductor body to form input, output and bias electrodes of a CCD in a first level or plane of the structure. In a subsequent, second series of metal pattern forming steps, a plurality of charge transfer electrodes are formed between the CCD input and output electrodes, and simultaneously an annular charge isolation electrode is deposited so as to completely surround the input, output, and charge transfer electrodes of the CCD. These electrodes deposited in this second series of metal pattern forming steps lie in a second level or plane of the structure being fabricated. Next, a dielectric mask is formed on the surface of the last named electrodes. Openings ("vias") are formed therein which are aligned with the input, output, charge transfer and charge isolation electrodes. Thereafter, a third series of metal pattern forming steps are utilized to form a plurality of crossover or lead-in electrodes which are deposited in the above openings in the dielectric mask to provide electrical signal and bias coupling to the electrodes formed in the above first and second series of metal pattern forming steps. Thus, by forming the charge isolation electrode simultaneously with the electrodes of the charge coupled device per se, the total number of device fabrication steps are minimized.

4 Claims, 8 Drawing Figures

SCHOTTKY BARRIER CHARGE COUPLED DEVICE (CCD) MANUFACTURE

The Government has rights in this invention pursuant to Contract No. F33615-77-C-1082 awarded by the U.S. Department of the Air Force.

RELATED APPLICATIONS

This is a divisional application of Ser. No. 520,745, filed on Aug. 5, 1983, now abandoned, which is a continuation of application, Ser. No. 209,190, filed on Nov. 17, 1980, now abandoned; which was a continuation of application, Ser. No. 966,939, filed on Dec. 5, 1978, all now abandoned.

FIELD OF THE INVENTION

The present invention relates to GaAs charge coupled devices and fabrication processes therefor and more particularly to such charge coupled devices having an overall planar construction and individual CCD electrical isolation. These planar CCD's may be produced at improved process yields and with high resolutions.

BACKGROUND OF THE INVENTION

Charge coupled devices (CCD's) have been used for several years as a basic signal processing element of computers and the like, and these devices typically include signal input and output electrodes disposed on the surface of a semconductor body for injecting and receiving charge, respectively, which is propagated along the "channel" of the CCD. This channel will typically be part of an epitaxial layer which has been previously grown on a larger underlying semiconductor substrate member. This epitaxial channel approach is used to provide appropriate purity and thickness control over the CCD channel, which is the main charge transfer medium of the structure. As is well known, a plurality of charge transfer electrodes are selectively spaced between these input and output CCD electrodes and are adapted to receive individually controllable "clock" signals. These clock signals are received in preestablished phase relationships for controlling the flow (direction, velocity and amplitude) of charges or charge packets which are propagated along the CCD channel between input and output electrodes.

The earliest CCD's were fabricated in silicon, rather than GaAs, partially as a result of the advanced state of the silicon MOS planar techology and the ability to form high quality silicon dioxide passivation layers on silicon surfaces. This feature is particularly desirable where the CCD charge transfer electrodes are deposited on top of a surface insulating ($SiO_2$) layer to receive control potentials which are capacitively coupled through the $SiO_2$ insulating layer to control the flow of charge in the CCD channel region. Although several different surface dielectrics have been proposed and used for GaAs, there is no surface dielectric in the GaAs technology which is comparable in its quality and passivation characteristics with silicon dioxide in the silicon technology. For this reason, the use of metal-semiconductor barrier (Schottky barrier) gates, in contrast to insulated gates used in silicon technology, have been employed in all known GaAs CCDs.

On the other hand, GaAs CCDs offer certain distinct advantages over silicon CCDs as a result of the higher carrier mobilities and thus higher achievable switching speeds in GaAs as contrasted to silicon. Thus, as a result of these certain obvious advantages that this III-V compound material offers over silicon in the fabrication of high speed charge coupled devices, substantial efforts have been made recently in the GaAs CCD technology directed toward improving GaAs CCD process yields and integrated circuit array and device operation.

One of the requirements to be considered when fabricating large CCD arrays on a single chip of GaAs is that of electrically isolating adjacent CCDs, one from another, and confining charge flow to the channels of the individual CCDs and also preventing electrical charges from adjacent devices from entering a CCD channel. One approach to this electrical isolation requirement is to mesa etch the CCD channel layer, which typically will be an epitaxial, diffused or ion implanted layer, in order to physically isolate individual CCD's within distinct mesa regions on the gallium arsenide chip. These mesa etch approaches have been described in the following two publications: (1) W. Kellner, H. Bierhenke and H. Kniepkamp, 1977 IEDM Technical Digest, paper 24.7., and (2) I. Deyhimy, J. S. Harris, R. C. Eden, D. D. Edwall, S. J. Anderson and L. O. Bubulac, Appl. Phys. Lett. 32, 383 (1978).

Another approach which uses a combination of a mesa geometry and a surrounding metal guard ring or barrier is described by A. J. Hughes, W. Eccleston, R. A. Stuart, *International Conference of Technology and Application of CCD's*, 1974, at pages 270-273. However, all of these prior art approaches which use mesa geometries and Schottky barrier electrodes in the fabrication of gallium arsenide CCD's have the disadvantage that the presence of the semiconductor mesas increases the difficulty of performing the required photolithography, since it is difficult to achieve high resolution lithography on non-planar surfaces. Additonally, layers of insulation and metal which must be formed over these non-planar mesa surfaces often suffer from fatigue and cracking because of the mechanical stress imparted to these overlying layers by edges of the mesas. Furthermore, at sufficiently high voltages, voltage breakdown can occur at the lower edges or base of the mesa at its intersection with the underlining semiconductor material. Thus, the desirability of forming a completely planar Schottky barrier CCD or CCD array in a gallium arsenide semiconductor is manifest.

SUMMARY OF THE INVENTION

The general purpose of this invention is to provide a new and improved planar Schottky barrier gallium arsenide CCD and fabrication process therefor which has most, if not all, of the advantages of the above types of mesa geometry gallium arsenide CCDs, while overcoming some of the significant disadvantages associated with the construction and processing of mesa geometries in semiconductors. This general purpose is achieved while simultaneously providing the necessary electrical isolation between adjacent CCDs fabricated in a large CCD array.

To accomplish this purpose, we have discovered and developed a novel charge-coupled device and associated electrical isolation structure which is constructed by initially providing a chosen semiconductor body having a surface channel region therein of suitable purity and thickness for efficiently transporting electrical charge therein under the control of suitable electrical signals. In a first level or plane of metalization, input, output, and bias ohmic contact electrodes are formed on the surface of the CCD channel region and are alloyed therein to provide good ohmic contact to the underlying CCD channel. In a second level or plane of metalization, charge transfer electrodes are disposed on the surface of the CCD semiconductor channel and are selectively spaced between the input and output ohmic contacts, and simultaneously metal overlay contacts are formed over the input, output, and bias ohmic contacts in this second level of metalization. A charge isolation or barrier electrode is also formed in this second level or plane of metalization and completely surrounds the input, output and charge transfer electrodes of the CCD.

Thereafter a suitable dielectric mask is formed over all of the electrodes deposited in this second layer of metalization. Next, a plurality of lead-in or crossover electrodes are deposited on this dielectric mask in a third level or plane of metalization, and these electrodes extend through openings in the dielectric mask and into electrical contact with the electrodes formed in the second level or plane of metalization. By applying a suitable bias voltage between the charge isolation electrode and a point of reference potential, a charge depletion region is established beneath the charge isolation electrode. This charge isolation region extends across the thickness of the channel region and completely surrounds the charge coupled device per se and its associated input, output, and charge transfer electrodes. Thus, signals which are applied to the charge input electrode will produce electrical charge (negative or positive charge carriers) in the CCD channel region and adjacent the CCD input electrode. This charge is propagated along the length of the CCD channel by properly phased clock signals applied to the charge transfer electrodes, and finally collected at the other end of the CCD channel at the CCD output electrode. Since this CCD operation per se is generally well known in the art, it is not described in further detail herein.

Accordingly, it is an object of this invention to provide a new and improved planar charged-coupled device and associated biasing structure and circuitry therefor which may be fabricated at improved process yields.

Another object is to provide a new and improved gallium arsenide CCD device and process of the type described which offers improved control over the photolithographic resolution involved in the fabrication of the device.

Another object is to provide a new and improved CCD and process of the type described which requires no semiconductor mesas, and thus offers improved device reliability, electrical isolation and voltage breakdown characteristics.

Another object is to provide a new and improved CCD and process of the type described which may be fabricated using a minimum (three) number of layers (levels) of CCD metalization, thus simplifying the process and reducing its cost while simultaneously improving process yields.

These and other objects and features of this invention will become more readily apparent in the following description of the accompaning drawing.

DRAWING

FIGS. 1a through 1f, respectively, illustrate, in schematic cross-section, a peferred sequence of processing steps utilized in arriving at the preferred embodiment of the invention shown in FIG. 1f.

DESCRIPTION OF THE PREFERRED EMBODIMENTS

Figure 1A:
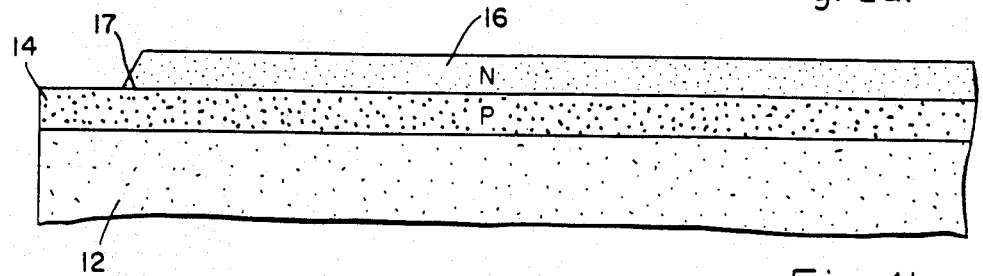

Referring now to FIG. 1a, there is shown a preferred semiconductor sub-structure starting material includes a chromium doped semi-insulating gallium arsenide substrate 12 which is typically about 14 mils in thickness and has a resistivity of about $10^8$ ohm-centimeters. The semi-insulating gallium arsenide substrate 12 is commerically available from a number of well-known semiconductor companies, and will have a chromium content typically on the order of 0.2 parts per million. Using the vertical slide bar liquid phase epitaxial (LPE) growth technique described in U.S. Pat. No. 4,026,735 of G. S. Kamath et al, a first thin P type epitaxial layer 14 of gallium arsenide is formed on the upper surface of the gallium arsenide substrate 12. The GaAs layer 14 will typically will be from between 3 and 10 micrometers in thickness and will have a P type doping concentration of $1 \times 10^{15}$ acceptors per cubic centimeter. Thereafter, using the same vertical slide bar LPE process in the Kamath et al U.S. Pat. No. 4,026,735, a second thin N type epitaxial layer 16 of gallium arsenide is grown on the upper surface of the P type layer 14 and is preferably on the order of 1.5 to 2.0 micrometers in thickness. The doping concentration of the N type layer 16 should be approximately $1 \times 10^{16}$ donors per cubic centimeter.

The sub-structure of FIG. 1a is then appropriately masked and etched to form the mesa contour 18 in the thin upper GaAs epitaxial layer 16, but this mesa contour 18 is not for purpose of electrically isolating individual adjacent charge-coupled devices and is not of the type of mesa construction referred to and discussed in the prior art references cited above. Rather, this mesa contour 18 is merely to isolate the CCD device to be described from the left-hand bias contact 20, and as will be shown below with reference to FIG. 2, this mesa contour construction 18 can, if desired, be totally eliminated from the process.

Figure 1B:
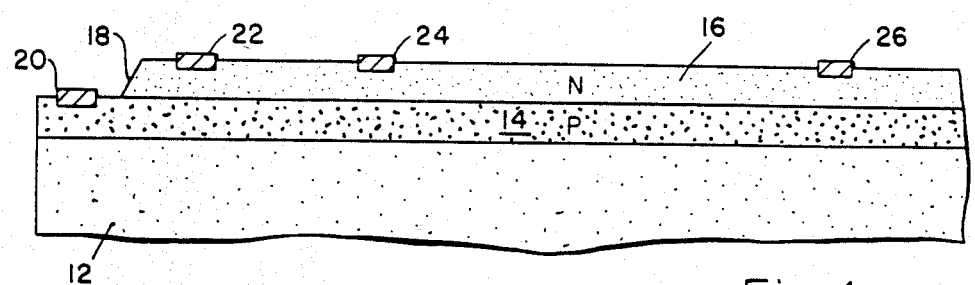
Figure 1C:
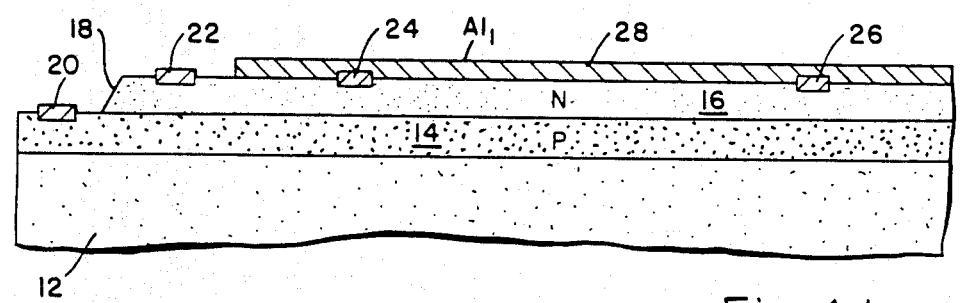

Once this mesa construction 18 of FIG. 1b has been completed, a plurality of germanium-gold (Ge:Au) ohmic contacts 20, 22, 24 and 26 are deposited as shown on the upper surface of the semiconductor structure. These contacts are thereafter annealed at an elevated temperature of approximately 430° C. in a reducing atmosphere, or in the presence of a forming gas, to alloy these contacts 20, 22, 24 and 26 into the semiconductor structure and thus provide good ohmic connections to the remainder of the CCD device to be described. The germanium-gold alloy used for making ohmic contacts to gallium arsenide is well known to those skilled in the art, and these contacts will typically be about 0.25 micrometers in thickness.

The structure of FIG. 1b is then transferred to a conventional aluminum vacuum evaporation station where a second level of metalization is deposited initially as a thin layer 28 which overlies the ohmic contacts 24 and 26. These ohmic contacts will eventually become the input and output ohmic contact electrodes for the CCD to be electrically isolated. Then, using conventional known photolithographic masking and metal etching steps, the thin metal layer 28 is etched to leave covering aluminum electrodes 30 and 32 atop the ohmic contacts 24 and 26, respectively, and also a plurality of charge transfer electrodes 34, 36, 38, and 40 which are selectively spaced as shown above the CCD channel 42. An outer annular charge isolation guard ring or barrier electrode 44 is also formed during this metal etching step and completely surrounds the input, output and charge transfer electrodes of the CCD. Since it is necessary to closely control the spacing between the barrier electrode 44 and the CCD electrodes adjacent thereto, it is particularly advantageous that the barrier electrode 44 and the CCD electrodes are formed in the same photolithographic and metal deposition step. All of the aluminum electrodes 30, 32, 34, 36, 38, 40 and 44 which are etched from the single aluminum layer 28 are all of the same height, typically 0.1 micrometer in thickness, and adhere suitably to the upper surface of the epitaxial layer 16. The intermediate steps of depositing, developing, and removing the necessary photoresist mask used in forming the metal electrode pattern shown in FIG. 1d have been omitted from the drawing for sake of simplicity. This photoresist technology, using a standard ultraviolet source to expose a known resist such as Kodak Metal Etch Resist (KMER), is well known in the art and is described in some detail, for example, by William S. DeForest in a book entitled, *Photoresist: Materials and Processes*, McGraw-Hill, 1975, incorporated herein by reference.

Figure 1D:
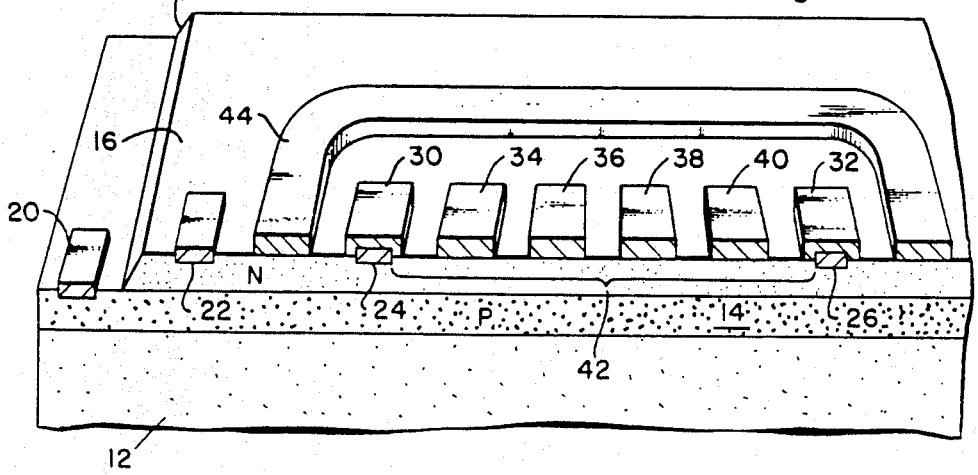

Upon completion of the metal etching step used to form the metal electrode pattern shown in FIG. 1d, the substructure of FIG. 1d is transferred to a plasma nitride deposition chamber (not shown), and the particular deposition chamber actually used in the reduction to practice of this invention was model PND (plasma nitride deposition) 301 purchased from the LFE Corporation of Waltham, Mass. This film deposition apparatus (not shown) includes a main plasma reaction chamber having one gas feed line connected to a source of $N_2+N_2O$ and another gas feed line connected to a source of silane and argon, $SiH_4$ and Ar, and these two feed lines are connected to the top of the reaction chamber. A vacuum pump is connected to another feed line leading into the bottom of the reaction chamber and pulls a pressure of approximately one Torr within the chamber. The reaction chamber also includes a heater plate upon which the sub-structure FIG. 1d is placed, and an RF induction coil surrounds a portion of the chamber and is operated at 13.56 megahertz, with an RF power of approximately 100 watts. This RF energy produces the plasma deposition from the mixture of the above identified reactant gases, and by carefully controlling the flow rates of these reactant gases, there will be deposited a thin film of silicon-oxy-nitride ($SiO_xN_y$) where $x \simeq y \simeq 1$.

Plasma deposition processes are generally known to those skilled in the nitride film deposition art, and are discussed in some detail by J. Lyman in *Electronics*, July 21, 1977 at page 88 et seq. A thin uniform film of $SiO_xN_y$ (not shown) was deposited on the structure of FIG. 1d to a thickness of approximately 0.4 micrometer, and thereafter, using conventional photoresist and metal mask formation techniques, a thin aluminum metal mask (also not shown) was formed over the $SiO_xN_y$ layer surface and had a plurality of openings therein exposing portions of the $SiO_xN_y$ film. Exposure to a plasma of PDE-100 etching gas (LFE Corp.) in the $SiO_xN_y$ deposition apparatus etches the $SiO_xN_y$ but does not etch the aluminum metal mask atop the $SiO_xN_y$ layer, and thereby forms the openings 46 in the $SiO_xN_y$ mask which are aligned with the underlying metal electrodes 30, 32, 34, 36, 38, 40 and 44. The silicon-oxy-nitride mask 48 is approximately 0.4 micrometer in thickness and was deposited at a substrate temperture of about 300° C.

Figure 1E:
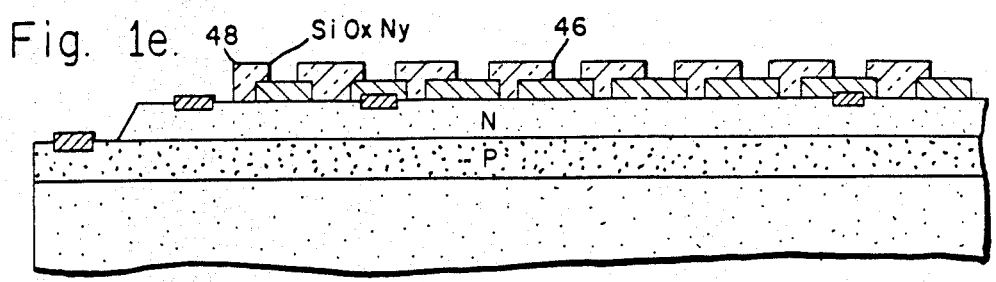
Figure 1F:
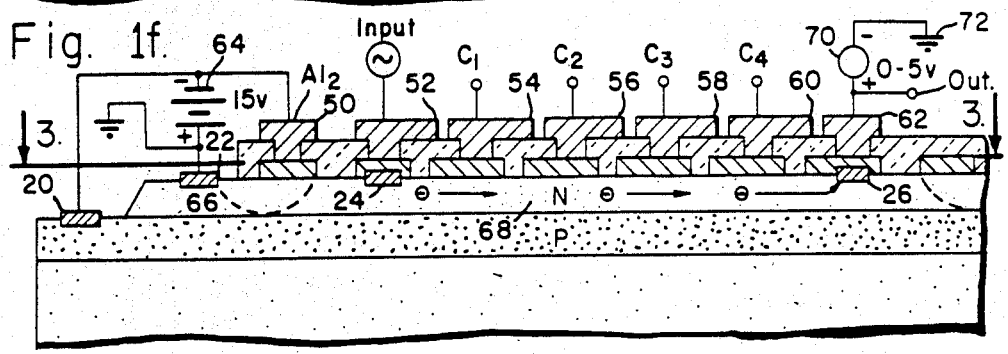

The sub-structure of FIG. 1e was then transferred back to a conventional aluminum evaporation station where a thin layer of aluminum (not shown) was initially deposited over the top of the silicon-oxynitride mask 46 and then photoresist-masked and etched using conventional aluminum etching techniques to form a third layer or level of cross over or feed-in electrodes 50, 52, 54, 56, 58, 60 and 62 as shown in FIG. 1f. The metal etch mask used in shaping the third level of cross over or lead-in electrodes shown in FIG. 1f was configured to provide the inverted L shaped geometry of the interior electrodes 52, 54, 56, 58, and 60 as shown, so that the right hand portion of these electrodes are positioned asymmetrically with respect to the underlying silicon-oxynitride mask 48. This CCD electrode geometry was specifically chosen so that the electric fields extending beneath these electrodes will have a predetermined lateral influence on charges moving from left to right in the CCD channel region 16, particularly beneath the charge transfer electrodes 54, 56, 58 and 60. This geometry in the third level of lead-in electrodes improves the overall charge transfer efficiency of the CCD structure.

In operation, the guard ring or isolation barrier electrode lead 50 in FIG. 1f is connected to a suitable source 64 of DC supply voltage. The positive terminal of the DC supply 64 is grounded at the CCD channel bias electrode 22, whereas the negative terminal of the DC supply voltage 64 is connected to a point of reference potential at the left side ohmic contact 20. By applying the DC bias voltage 64 as shown in FIG. 1f, an annular depletion region 66 is created as shown completely across the thickness of epitaxial channel 16 beneath the guard ring electrode 44. This annular depletion region thereby electrically isolates the area on the GaAs chip in which the CCD structure is fabricated. Thus, when using N type gallium arsenide for the epitaxial layer 16, including CCD channel 68 therein, the charge carriers will be lectrons which flow as shown from beneath the input electrode 24 and through the CCD channel region 68 to the output electrode 26 beneath the output crossover lead 62. These electrons are clocked from left to right through the CCD channel region 68 by the application of a plurality of clock voltages C1, C2, C3, and C4 connected as shown to the charge transfer crossover leads 54, 56, 58 and 60. The output crossover lead 62 is connected to a CCD output terminal and also to a variable source 70 of DC reference voltage whose other side is connected to ground 72 as shown.

Thus, it will be appreciated that all of the metal and insulation patterns formed atop the epitaxial CCD channel layer 16 in FIG. 1f are fabricated using planar processing and do not require the formation of semiconductor mesas with their attendant disadvantages previously described. Preferably, the spacing between adjacent GaAs surface electrodes such as 34 and 36 in the second level of metalization is approximately 1 micrometer and, generally speaking, corresponds closely to the thickness of the epitaxial layer 16 which, as mentioned above, is slightly larger than this electrode spacing and is on the order of 1.5 to 2.0 micrometers. Since these electrode spacings are very small, the importance of depositing the barrier electrode 44 simultaneously with the closely adjacent CCD and bias electrodes should again be emphasized.

Figure 2:
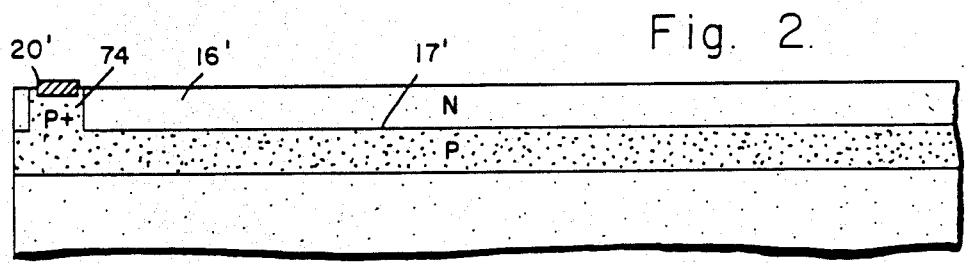
FIG. 2 is a partial schematic cross-section view illustrating an alternative, planar epitaxial layer construction for providing the necessary bias and PN junction isolation for the CCD channel region.

Referring now to FIG. 2, there is shown a completely planar construction of the N type epitaxial layer 16 wherein a P+diffused or ion implanted region 74 has been formed in the epitaxial layer 16' to electrically connect the underlying P type epitaxial layer to the ohmic contact member 20'. This ohmic contact 20' is utilized to provide the required reverse bias to the PN junction 17' and thus to provide the necessary PN junction isolation for the CCD channel region of the structure. The sub-structure in FIG. 2 is then planar processed in accordance with the above description of FIGS. 1b through 1f to form the multiple spaced metalization and insulation patterns atop the surface of the GaAs epitaxial layer 16' as indicated in FIG. 1f. Alternatively, a P+ substrate could be used and an ohmic contact made to the back of the wafer.

Figure 3:
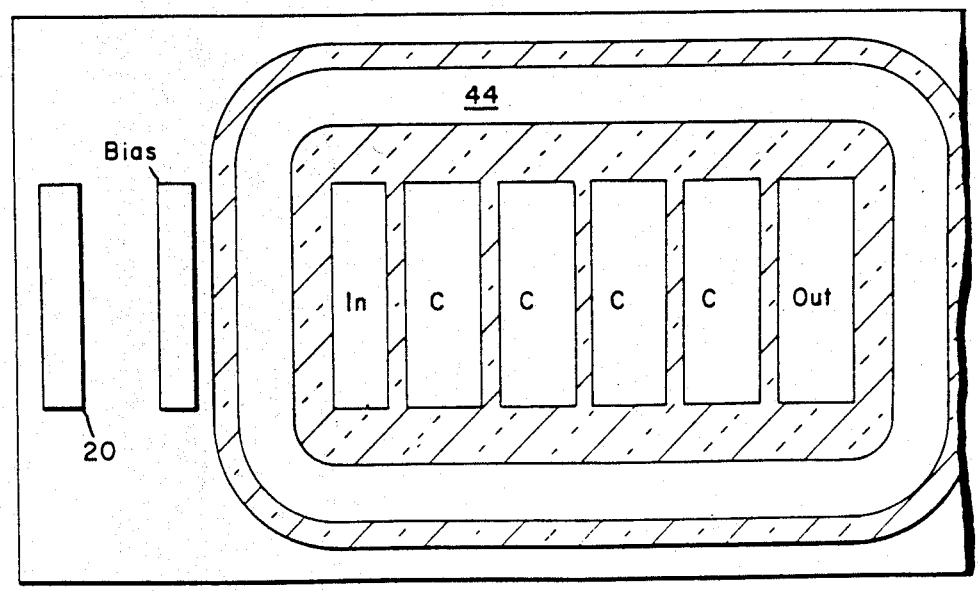
FIG. 3 is a plan view of the sub-structure illustrated in FIG. 1d and is useful to show the geometry of the metal electrodes formed in the second series of metalization steps to be further described.

Referring now to FIG. 3, there is shown a plan view of the sub-structure of FIG. 1d, assuming of course that the mirror image of the structure in FIG. 1d is present to provide the total CCD chip being processed in accordance with the present invention. Thus, it will be appreciated that the annular guard ring or barrier electrode 44 may be formed in any desired geometry, such as an approximate rectangular configuration as shown which completely surrounds the input, output and charge transfer electrodes of the CCD. Thus, the depletion region 66 extending beneath the electrode 44 and extending across the epitaxial layer 16 when appropriate bias is applied to the electrode 44 completely isolates the CCD structure electrically, assuming of course that the PN junction 17 is reverse biased.

The fixed depletion region 66 is created in accordance with well known Schottky-gate or metal-semiconductor field effect transistor (MESFET) device operation and therefore will not be discussed herein in detail. By analogy, the barrier electrode 44 is equivalent to the gate electrode of a MESFET, whereas the adjacent ohmic contacts 22 and 24 are equivalant to the source and drain electrodes of the FET. For a comprehensive review of MESFET transistor construction and operation, reference may be made by an article by S. V. Bearse entitled "GaAs FETs: Device Designers Solving Reliability Problems" *Microwaves,* February, 1976 at pages 32–52. The latter article, including all of its reference publications, are incorpoated herein by reference.

It will be understood and appreciated by those skilled in the art that the present invention in its broadest scope is not limited, materials-wise, to the particular metals and insulator used in the above described preferred embodiment. Instead, other suitable metals and insulators used in the planar GaAs CCD technology may be substituted for those described above without departing from the scope of this invention.

It will also be understood by those skilled in the art that the present invention may be practiced using materials other than gallium arsenide, such as, for example, InSb, (Hg,Cd)Te, GaSb, (Ga,In)Sb and Ge. In addition, the CCD channel is not restricted to epitaxial layers, and may be formed using ion-implanted or diffused layers. Furthermore, the particular P and N type conductivity of these layers may be reversed within the scope of this invention. The main reason for using an N type channel in the above described preferred embodiments is that the charges, i.e. electrons, have a higher mobility than the mobility of holes in a P type semiconductor.

It should also be understood that the present invention is not restricted to the use of a semi-insulating substrate starting material and may instead use a P or N type substrate upon which a layer of opposite type conductivity semiconductor material is formed. In this case, appropriate PN junction reverse bias and isolation may be accomplished by using a backside contact rather than a top surface ohmic contact 20 or 20'.

Finally, it will also be appreciated by those skilled in the art that the CCD gates are not limited in number to four and, in practice, will usually include a much larger number of gates or charge transfer electrodes.

What is claimed is:

1. A process for fabricating a planar charge-coupled device structure which includes the steps of
   (a) providing a semiconductor body having an outermost channel region suitable for coupling charge between selected locations therein under the control of electrical signals,
   (b) forming input, output, and bias ohmic contact electrodes at selected locations on said surface channel region and in a first level or plane above said semiconductor body,
   (c) forming a plurality of selectively spaced charge transfer electrodes between said input and output ohmic contacts and having upper surfaces lying in a second level or plane above said semiconductor body, while simultaneously forming a charge isolation electrode surrounding said input, output and charge transfer electrodes and also lying in said second level or plane,
   (d) forming an insulating mask atop said input, output, charge transfer and charge isolation electrodes and having openings therein aligned with said input, output, charge transfer and charge isolation electrodes, and
   (e) depositing a plurality of cross-over or lead-in electrodes in said openings in said insulating mask and having surfaces lying in a third level or plane atop said semiconductor body, whereby said charge isolation electrode is formed simultaneously with the formation of said charge transfer electrodes to thereby enable close control over the spacing between said charge isolation electrode and other electrodes in the same level of metalization and simultaneously minimize the number of levels of metalization within said structure and thereby maximize process yields and device reliability.

2. The process defined in claim 1 wherein the formation of input and output electrodes of said device also includes depositing a layer of metalization over said input and output ohmic contacts simultaneously with the formation of said charge transfer and charge isolation electrodes so that said input and output electrodes have surfaces in the same level of metalization as said charge transfer and charge isolation electrodes.

3. The process defined in claims 1 or 2 above wherein the provision of said semiconductor body includes initially providing a semi-insulating substrate of gallium arsenide and thereafter exposing said substrate to sucessive epitaxial deposition processes to thereby initially form a P type gallium arsenide layer atop said semi-insulating gallium arsenide substrate and thereafter forming an N type gallium arsenide layer atop said P type gallium arsenide layer to thereby form said outermost channel region as part of said N type layer.

4. The process defined in claims 1 or 2 above wherein the formation of said insulating mask includes plasma depositing a dielectric mask of silicon oxynitride, $Si\text{-}O_xN_y$, where $x \simeq y \simeq 1$; the formation of said ohmic contacts in said first layer of metalization includes annealing germanium gold electrodes to the surface of said channel region, and the formation of said second and third levels of metalization includes evaporating patterns of aluminum to form respectively input, output, charge transfer and charge isolation electrodes in said second level of metalization and to form cross-over or lead-in electrodes in said third level of metalization.

* * * * *